United States Patent
Jang et al.

(10) Patent No.: US 6,704,228 B2
(45) Date of Patent: Mar. 9, 2004

(54) SEMICONDUCTOR MEMORY DEVICE POST-REPAIR CIRCUIT AND METHOD

(75) Inventors: Seong-Jin Jang, Yongin (KR); Kyu-Hyoun Kim, Kyungki-do (KR)

(73) Assignee: Samsung Electronics Co., Ltd, Suwon (KR)

( * ) Notice: Subject to any disclaimer, the term of this patent is extended or adjusted under 35 U.S.C. 154(b) by 40 days.

(21) Appl. No.: 10/160,703

(22) Filed: May 30, 2002

(65) Prior Publication Data

US 2003/0123301 A1 Jul. 3, 2003

(30) Foreign Application Priority Data

Dec. 28, 2001 (KR) .......................................... 2001-87113

(51) Int. Cl.[7] .............................. G11C 29/00; G11C 7/00
(52) U.S. Cl. ...................................... 365/200; 365/225.7
(58) Field of Search ................................ 365/200, 225.7

(56) References Cited

U.S. PATENT DOCUMENTS

| | | |
|---|---|---|
| 4,473,895 A | 9/1984 | Tatematsu |
| 5,898,626 A | 4/1999 | Chiang et al. |
| 5,999,480 A * | 12/1999 | Ong et al. ............. 365/230.06 |
| 6,061,291 A | 5/2000 | Zheng |
| 6,077,211 A | 6/2000 | Vo |
| 6,205,063 B1 | 3/2001 | Aipperspach et al. |
| 6,356,498 B1 * | 3/2002 | Keeth ........................ 365/226 |

* cited by examiner

Primary Examiner—VanThu Nguyen
(74) Attorney, Agent, or Firm—Marger Johnson & McCollom, P.C.

(57) ABSTRACT

The ability to repair defective cells in a memory array, by replacing those cells with redundant cells, is improved using a redundant memory line control circuit that employs two types of redundancy programming. Most, or all, redundant memory lines can be programmed while the memory array is in a wafer state by, e.g., cutting laser fuses. But at least one memory line can be programmed subsequent to device packaging ("post repair") using, e.g., commands that cut electric fuses. Preferably, the redundant memory line(s) that are reserved for post repair are selectable among the same redundant memory lines that can be programmed using laser fuses. This allows all redundant memory lines to be available for laser repair, if needed, but also allows a redundant memory line to be selected for post repair after it has been determined that that redundant memory line is defect-free. This increases the likelihood that a device will be repairable, and yet does not unnecessarily waste redundant memory lines by pre-dedicating them to laser or post repair.

16 Claims, 14 Drawing Sheets

SEMICONDUCTOR MEMORY DEVICE POST-REPAIR CIRCUIT AND METHOD

This application claims priority upon Korean Patent Application No. 2001-87113, filed on Dec. 28, 2001, the contents of which are herein incorporated by reference in their entirety.

BACKGROUND OF THE INVENTION

1. Field of the Invention

The present invention pertains generally to semiconductor memory device repair structures and repair methods, and more particularly to post-repair structures and methods.

2. Description of the Related Art

Semiconductor memory devices, e.g., Dynamic Random Access Memory (DRAM) devices, contain a plurality of memory cells arranged in a row/column array. Each memory cell typically stores one bit of information. The array contains row signal lines, and column signal lines arranged perpendicular to the row lines. A memory cell is placed at each intersection of a row line and a column line. Concurrently addressing the array row line and the array column line that connect to a particular memory cell accesses that memory cell.

Most uses for semiconductor memory devices require that 100% of the memory cells, row lines, and column lines be operational. In practice, many—even most—main memory cell arrays on a given wafer may fail to achieve 100% operability. Consequently, most device designs incorporate a relatively small redundant array of memory cells that can be substituted for a limited number of defective cells.

In one common design, the redundant array is configured in redundant columns of memory cells, each connected to a redundant column line that crosses the main memory cell array row lines. Each redundant column line can therefore be substituted for a main memory cell array column found to have one or more defective cells. Each time a column of the main array is addressed, a redundancy control block compares the column address to the defective column address. When the defective column is addressed, the redundancy control block selects the redundant column associated with that defective column address instead.

A redundancy scheme that replaces defective rows with redundant rows is also in use. Some devices contain redundant rows and redundant columns, with associated circuitry.

Before a redundancy control block and its associated redundant column/row can be used, the defective line address must be programmed into the control block. To facilitate programming, the redundancy control block contains a fuse block. While the semiconductor memory device is in a wafer state, the main memory array is tested and defective cells are located. Considering, e.g., column replacement, a redundancy control block and redundant column are selected to replace a given defective column. The address of the defective column is set in the redundancy control block by selectively cutting fuses in the fuse block to represent that column address. Fuses are generally programmed using a laser beam to physically sever each fuse to be cut.

SUMMARY OF THE INVENTION

Although most memory array defects are detectable during wafer state testing, some defects may arise—or first become apparent—after a memory device is packaged. For such defects, the ability to repair the memory array after packaging may make the difference between a saleable unit and a scrap unit.

The repair of array defects after packaging is referred to as a post-repair capability. Laser-cut fuses do not have post-repair capability, as the packaging material prevents laser targeting and fuse cutting. In contrast, the described embodiments all contain a post-repair capability that uses electrically programmable fuse blocks. Such fuse blocks can be programmed after device packaging, using special programming command signaling applied to the device's normal package connections.

Although post-repair redundancy is attractive because it allows the correction of defects that arise during packaging, such redundancy does have drawbacks. The post-repair redundancy control block and associated electrical programming circuitry require much more circuit area than a laser-cut fuse redundancy control block. Therefore, the cost of using electrically cut fuses rather than laser-cut fuses, in terms of wafer surface area, may outweigh the benefit of a post-repair capability.

In a first aspect of this description, a semiconductor memory device is disclosed. The memory device contains a dual-mode redundancy circuit that blends the advantages of wafer-state (e.g., laser-cut) fuse programming with the advantages of post-repair programming. This circuit contains a plurality of redundant memory lines (e.g., additional column or row lines, each addressing redundant cells). Each redundant memory line is associated with an attendant redundancy control block. The majority of the redundant control blocks contain laser fuse blocks, and can only be programmed prior to assembly of the memory device into a package. At least one of the redundant control blocks, however, contains an electrically programmable fuse block, and is capable of being programmed after assembly of the memory device into a package. Accordingly, such a device allows a dual-cycle repair method: most device repairs are made in the wafer state, with more economical laser fuse blocks; a small number of electrical fuse blocks are available and addressable after package assembly, however, in a post-repair mode, in case, e.g., packaging-related defects occur.

The above design has some redundant memory lines dedicated for laser repair, and some redundant memory lines dedicated for post repair. If a redundant memory line that is dedicated for post repair is itself defective, post repair becomes impossible. This is true even if good redundant laser-repair memory lines remain unused, as those lines cannot be used for post repair.

Thus, in a second aspect, a dual-mode redundancy circuit contains circuitry for increasing the likelihood that post repair can be effected. Generally, this circuitry allows a wafer-state address-storage-unit (e.g., a laser fuse block) to be associated with a redundant line. In a second configuration, this circuitry allows a post-repair address-storage-unit (e.g., an electric fuse block) to be associated with the same redundant line. Thus, a semiconductor memory device employing this type of dual-mode redundancy allows additional repair flexibility. For instance, during wafer-state testing, by default each redundant line may be associated with a laser fuse block. One defect-free redundant memory line is designated, during testing, for use in post repair. That redundant memory line is associated with the post-repair address-storage-unit, making it available for use in post repair.

In a related method, the semiconductor device has multiple redundant memory lines, each associated with a laser fuse/comparator. Main and redundant memory lines are tested to determine which lines are defective and which are defect-free. For each defective main memory line, a defect-free redundant memory line is designated, and the laser fuse/comparator associated with that redundant memory line is configured to replace the defective main memory line. When at least one defect-free redundant memory line remains undesignated after this step, at least one remaining defect-free redundant memory line is designated for use in post repair. The post-repair-designated redundant memory line is associated with a post-repair comparator instead of its associated laser fuse/comparator, and is then available for post repair.

BRIEF DESCRIPTION OF THE DRAWINGS

The embodiments may be best understood with reference to the attached drawings in which.

DETAILED DESCRIPTION OF THE EMBODIMENTS

Figure 1:
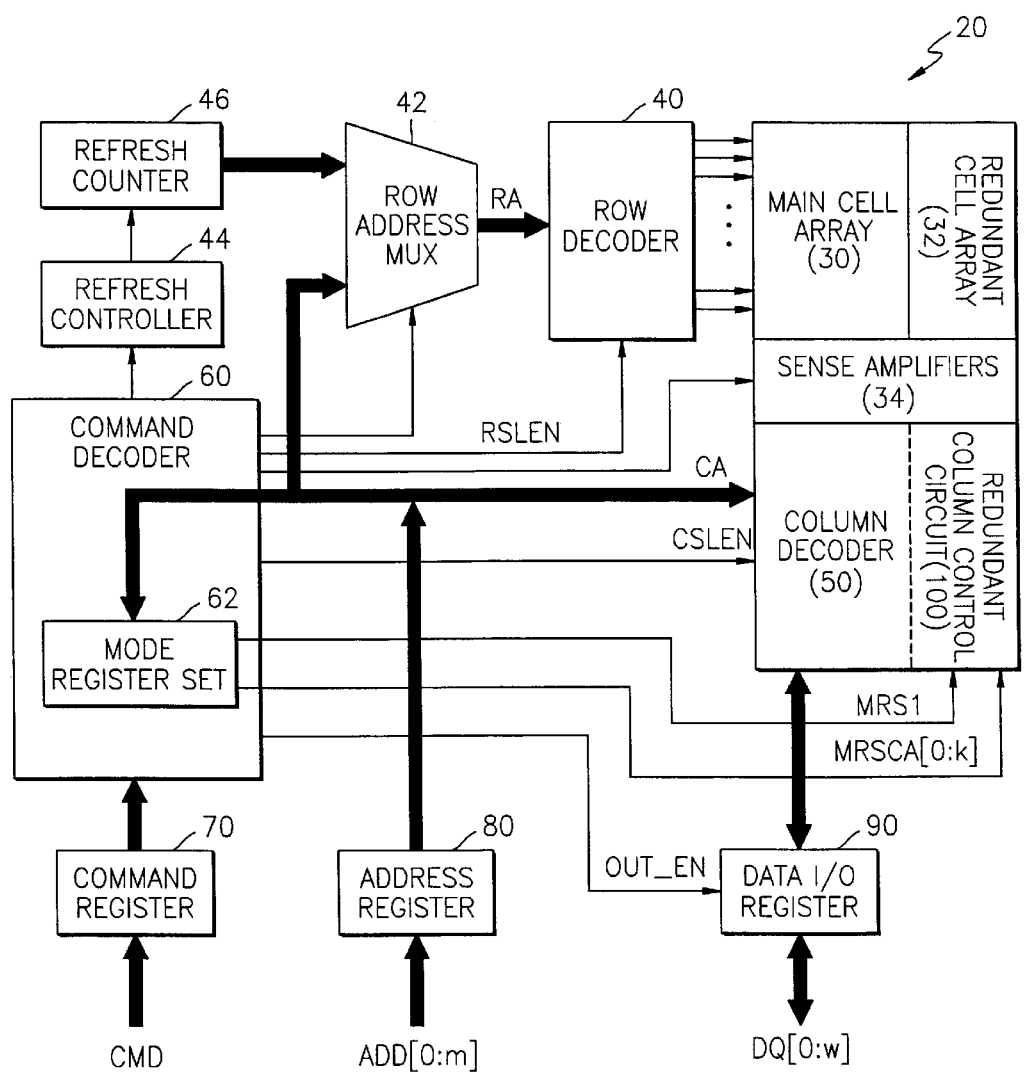
FIG. 1 contains a block diagram for a semiconductor memory device according to an embodiment of the invention.

FIG. 1 illustrates a block diagram for a semiconductor memory device 20—in this case a synchronous DRAM (SDRAM)—according to a first embodiment. Briefly, a main cell array 30 and redundant column cell array 32 are served by row and column circuitry. The column circuitry comprises sense amplifiers 34 and column decoder 50. Column decoder 50 selects, for each column address CA, the column (bit) line(s) that will be read/written to. Within column decoder 50, redundant memory line control circuit 100 determines when a redundant column will be substituted for a main column, based on column address CA and column select enable CSLEN.

The row circuitry comprises row decoder 40 and row address multiplexer 42. Row decoder 40 selects, for each row address RA, which row (word) line will be activated. Row select enable RSLEN indicates when RA is valid. Although no redundant row lines and circuitry are shown in device 20, such may exist and would be similar to redundant array 32 and control circuit 100. Note that RA has two sources, channeled through multiplexer 42: external row addresses, supplied through address register 80; and refresh row addresses, supplied from refresh counter 46, under the control of refresh controller 44.

Circuit input and output occurs through three register sets. Command register 70 receives command signals, such as activate word line, read, write, precharge, auto-refresh, load mode register, etc., over a command bus CMD from, e.g., an external memory controller (not shown). Address register 80 receives address signals ADD[0:m] over an address bus from the memory controller. And data I/O register 90 connects to bi-directional data lines DQ[0:w].

Command decoder 60 interprets received commands and generates appropriate control signals to the other memory device blocks. Mode register set (MRS) 62 can receive device settings over address bus ADD when a load mode register command is received on the CMD bus. In general, the MRS is used to define SDRAM operational parameters such as burst type, burst length, latency, etc. In the preferred embodiments, one function of the MRS is to set the fuse units in an electrical fuse box to an address supplied on the ADD bus, when a special command is received on the CMD bus.

Although more advanced features exist in many memory devices to which the present invention is applicable, the preceding description describes the basic features common to most SDRAM devices capable of supporting an embodiment of the present invention. Those features of device 20 that are particularly pertinent to the embodiments will now be explored in further detail.

Figure 2:
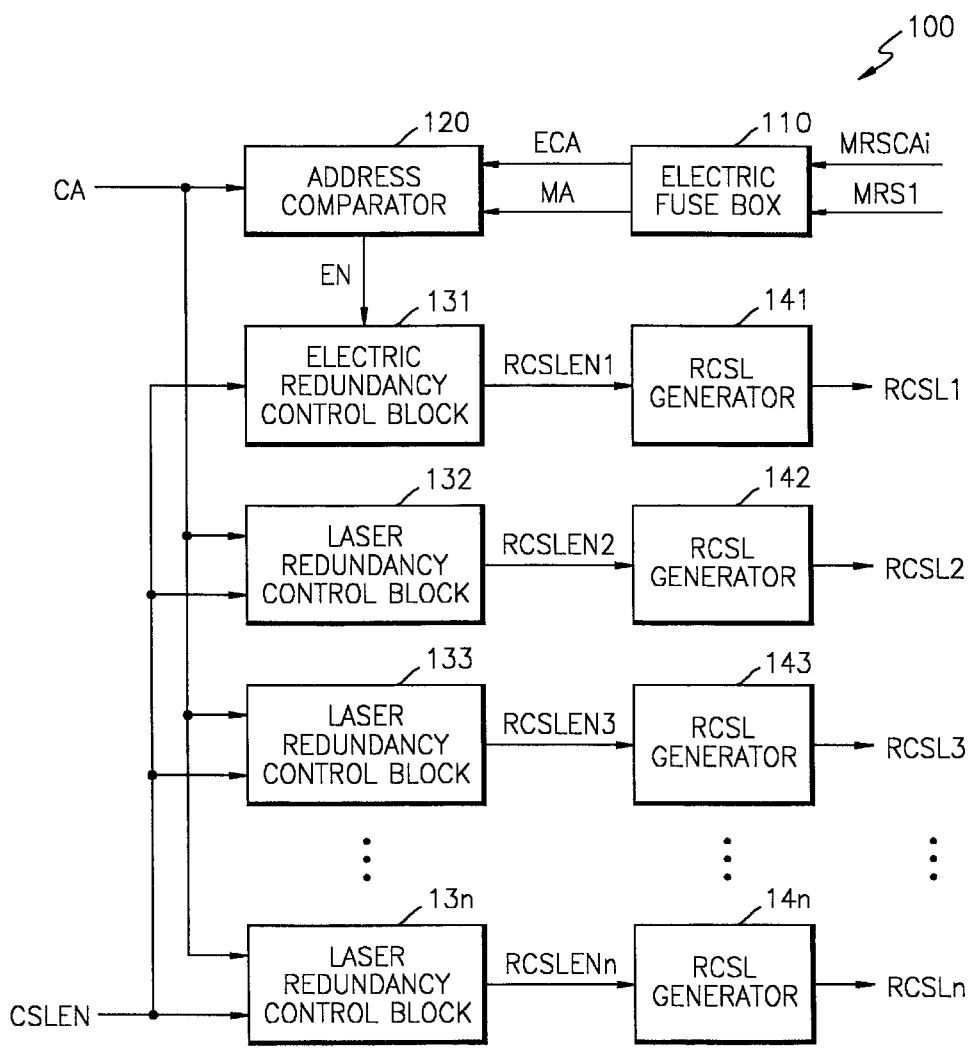
FIG. 2 contains a block diagram for a first embodiment of a dual-mode repair circuit.

FIG. 2 contains a block diagram of a basic dual-mode redundant column control circuit 100, according to a first embodiment of the invention. Referring to FIG. 2, redundant column control circuit 100 has an electric fuse box 110, an address comparator 120, an electric redundancy control block 131, laser redundancy control blocks 132 through 13n, and RCSL (redundant column select) generators 141 through 14n.

Redundant column control circuit 100 controls access to n redundant columns in redundant cell array 32 (FIG. 1). One of the n redundant columns is selected, instead of a defective main array column, when a corresponding redundancy column selection signal (RCSLi, i=1~n) is asserted by an RCSL generator 14i. Each of the RCSL generators is activated in response to a corresponding RCSL enable signal (RCSLENi, i=1~n) from a redundancy control block. Each RCSL generator 14i (i=1~n) can be implemented using two serially connected inverters (not shown).

Figure 3:
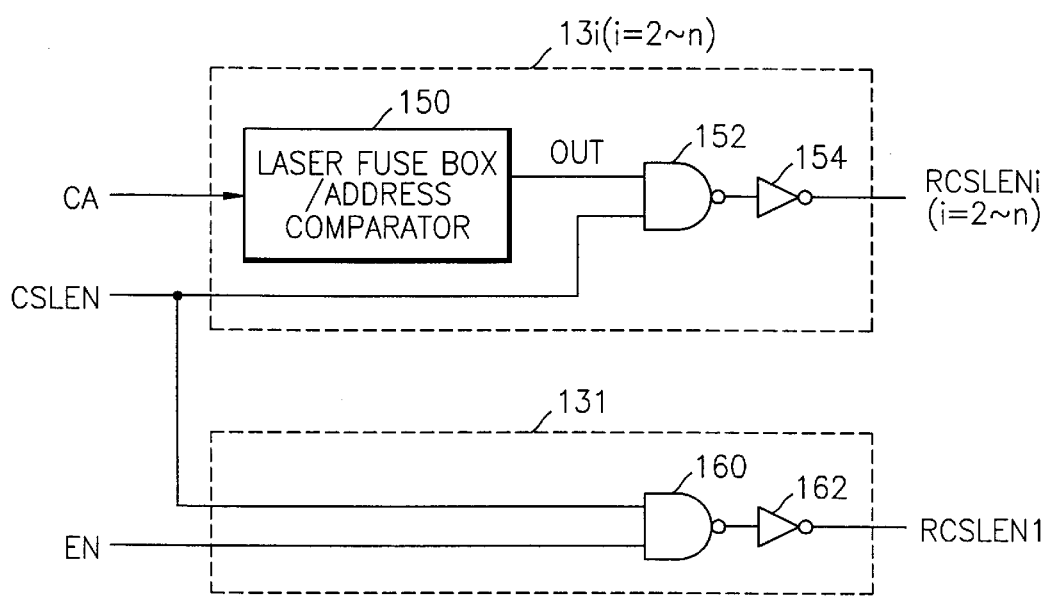
FIG. 3 shows additional circuit detail for the redundancy control blocks of FIG. 2.

FIG. 3 shows circuit detail for laser redundancy control blocks 132 to 13n, as well as for electric redundancy control block 131. Each laser redundancy control block contains a laser fuse box and address comparator (i.e., a laser fuse/comparator) 150. A laser beam can cut selected fuses in the laser fuse box during wafer stage repair operations. Thereafter, laser fuse/comparator 150 compares column addresses CA to the defective column address stored in the laser fuse box, and asserts OUT when CA matches the stored address. NAND gate 152, together with serial inverter 154, generates RCSLENi according to an AND operation—when both OUT and CSLEN (column select enable) are asserted, RCSLENi will also be asserted, and therefore redundant column i will be selected.

Electric redundancy control block 131 contains a NAND gate 160 with a serial inverter 162 to generate RCSLEN1 according to an AND operation—when both EN and CSLEN are asserted, RCSLEN1 will also be asserted, and therefore redundant column 1 will be selected.

EN is an output of address comparator 120, and is asserted when CA matches ECA (FIG. 2). ECA is an electrically stored defective column address from electric fuse box 110. Thus whereas redundant column lines 2 through n can only be programmed during wafer stage repair, redundant column line 1 can be programmed at any time, e.g., during a post-repair operation.

Figure 4:
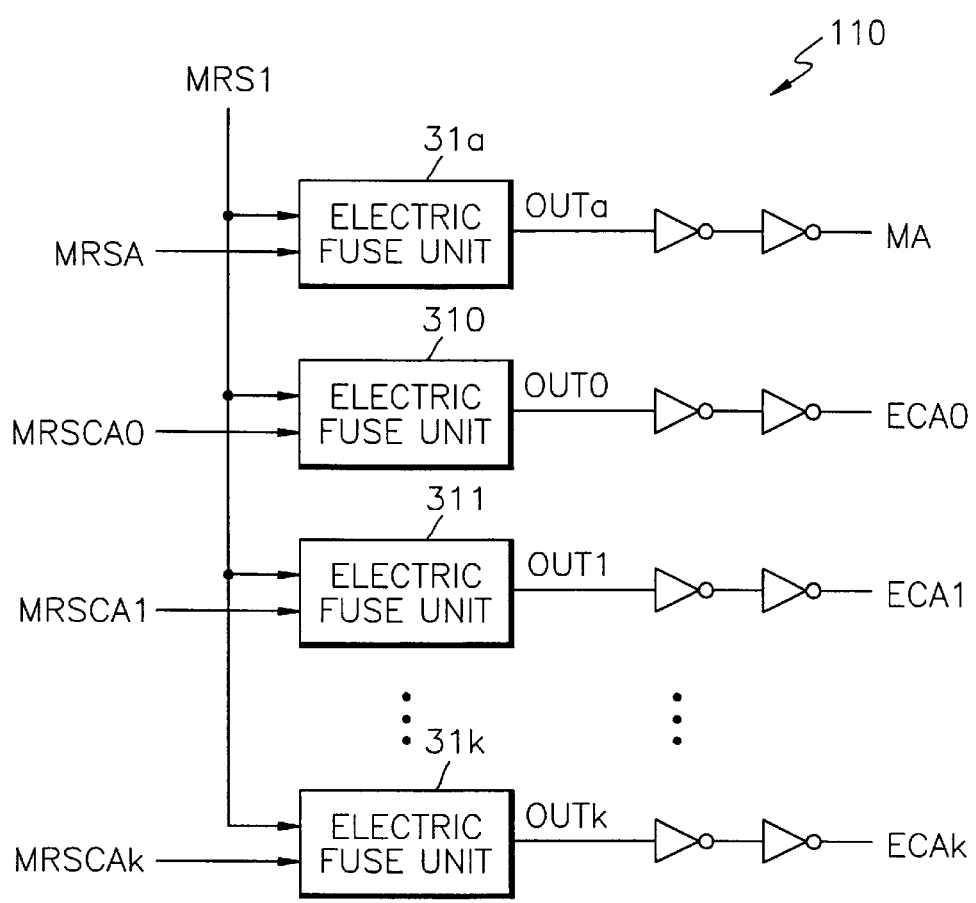
FIGS. 4, 5, and 6 show additional circuit details for the electric fuse block and address comparator of FIG. 2.
Figure 5:
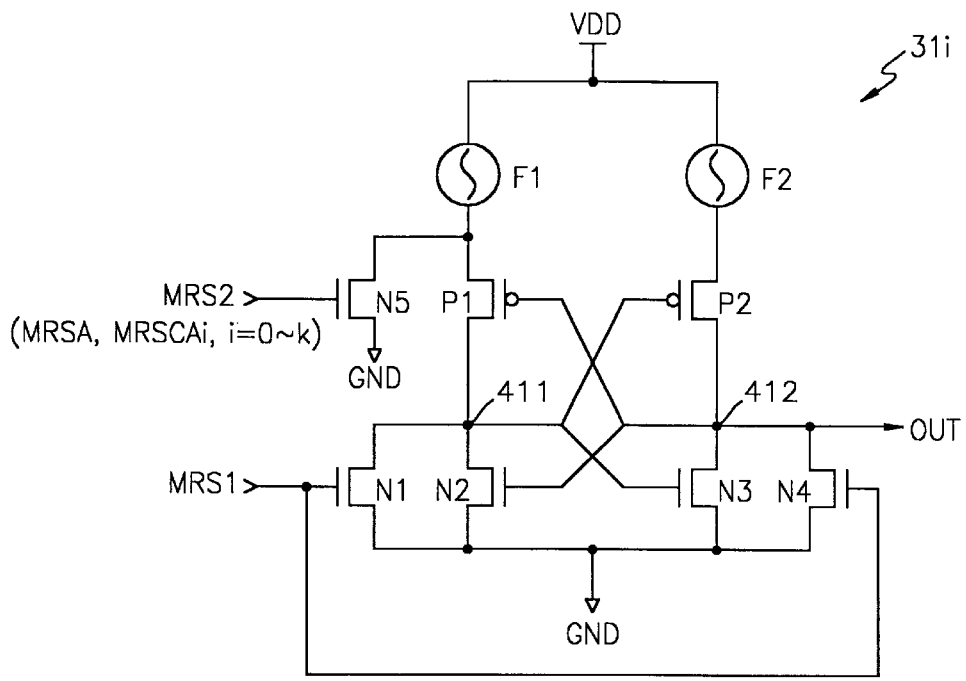

FIGS. 4 and 5 illustrate one embodiment of electric fuse box 110. Referring first to FIG. 4, electric fuse box 110 contains a plurality of electric fuse units ($31a$, $31i$, $i=0\sim k$) with buffered outputs. Each electric fuse unit holds one bit of data. Fuse unit $31a$ holds bit OUTa, which, after buffering, becomes a master access signal MA that indicates whether the electric fuse box has been programmed. Fuse unit $31i$, $i=0\sim k$, holds OUTi, which, after buffering, becomes an electric column address signal bit ECAi.

Mode register set (MRS) 62 (FIG. 1) generates the programming inputs (MRSA, MRSCA0 to MRSCAk) to fuse box 110 in response to an external command. Each electric fuse unit is initially fabricated in a first state, e.g., representing an unset address bit. If a given MRS programming input is asserted, the corresponding electric fuse unit is set to a second state, e.g., representing a set address bit. Thus to program fuse box 110, MRS 62 places the address of the column under repair on MRSCA0-k to program that address, and asserts MRSA to program the master access bit.

FIG. 5 is a detailed circuit diagram for one embodiment of an electric fuse unit $31i$ ($i=a$, $0\sim k$). Each electric fuse unit $31i$ has first and second fuses (F1, F2), first through fifth NMOS transistors (N1~N5), and first and second PMOS transistors (P1, P2). The drains of NMOS transistors N1 and N2, the drain of PMOS transistor P1, the gate of PMOS transistor P2, and the gate of NMOS transistor N3 each connect to a first node 411. The gate of PMOS transistor P1, the gate of NMOS transistor N2, the drains of NMOS transistors N3 and N4, and the drain of PMOS transistor P2 each connect to a second node 412. The signal present at the second node also forms an output signal (OUT). Each NMOS transistor source is grounded; the sources of P1 and P2 connect to VDD, respectively, through fuse devices F1 and F2. The drain of N5 connects to the source of P1.

Fuse unit $31i$ is fabricated such that the resistance of fuse F2 is larger than the resistance of fuse F1. Accordingly, with both fuses intact, node 412 (also tied to OUT) is driven to a logic low condition and node 411 is driven to a logic high condition when the fuse unit is powered.

A first input signal (MRS1), which is normally in a low state, is input to the gates of NMOS transistors N1 and N4. Input signal MRS1 is used to test whether or not fuse F1 is cut, as will be explained shortly.

A second input signal (MRS2) is input to the gate of transistor N5. Input signal MRS2 is used to electrically cut fuse F1. If input signal MRS2 is set to a "high" logic level, NMOS transistor N5 is turned on, causing a transient current—large enough to burn fuse F1—to flow through fuse F1. As fuse F1 is cut, transistor N5 also drops the potential at the source of transistor P1, and therefore at node 411 as well. As the voltage at node 411 decreases, transistor P2 is turned on and transistor N3 is turned off, raising the voltage at node 412. This in turn tends to turn on transistor N2, reinforcing the decreasing voltage at node 411 and the increasing voltage at node 412 until OUT switches to a high logic level.

After programming, input signal MRS1 can be used to determine whether the fuse F1 was fully cut by the assertion of input signal MRS2. In a test mode, MRS1 is momentarily taken to a high state to pull both node 411 and node 412 to a low state. If fuse F1 has been severed, node 412 recovers to a high state when MRS1 is taken back to a low state. If fuse F1 has not been severed, node 411 recovers to a high state when MRS1 is taken back to a low state.

Following the assertion/deassertion of MRS1, the repaired address line is tested. If the test is unsuccessful, it is assumed that one or more fuses was not completely cut, and therefore the redundant column was not successfully substituted for the defective column. In such a case, the electrical programming and testing steps can be repeated in order to re-attempt fuse cutting.

Figure 6:
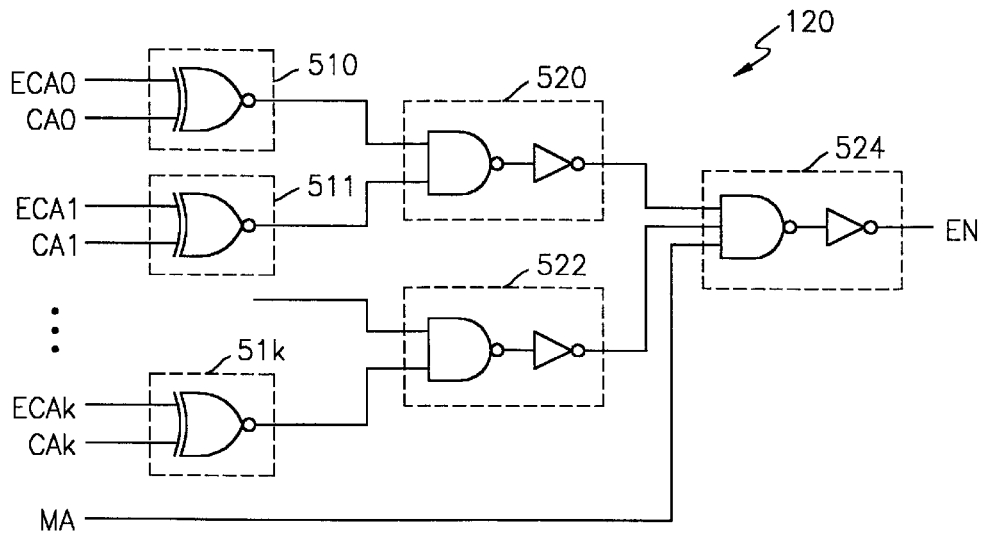

FIG. 6 is a detailed diagram for one embodiment of address comparator 120 of FIG. 2. Address comparator 120 has a plurality of comparing units ($51i$, $i=0\sim k$), and a plurality of AND logic gates (logic gates 520, 522, and 524 shown). Each AND gate is formed using a NAND gate with an inverter at its output.

Each comparing unit $51i$ ($i=0\sim k$) performs a one-bit XNOR function. Comparing unit $51i$ receives an electrical repair address bit (ECAi, $i=0\sim k$) and a corresponding external address bit (CAi, $i=0\sim k$), and compares the two bits. If the two bits are at the same logic level, the comparing unit $51i$ outputs a high logic level signal. If the two bits are different, the comparing unit $51i$ outputs a low logic level signal.

The output signal from each comparing unit $51i$ ($i=0\sim k$) and the master signal (MA) are ANDed and output as an electric repair activation signal (EN). Therefore, when signals output from all comparing units 510 through $51k$ are a "high" logic level—and the master access signal is also "high"—the electric repair activation signal (EN) is asserted.

The redundant column control circuit shown in FIGS. 2–6, and described above, provides improved repair capability as compared to a laser-fuse-only redundancy scheme, since one redundant column is reserved for post repair. At the same time, this embodiment capitalizes on the recognition that most array defects are present and detectable during wafer stage repair, by driving most redundant columns with more economical laser-fuse control circuitry.

One condition that the embodiment of FIG. 2 cannot correct for is a failure in the redundant column associated with the electric redundancy control block 131. Were this redundant column to be defective, post repair would be impossible, even if one or more of redundant columns 2 through n were defect-free and unused. In contrast, the second embodiment increases the likelihood that post repair will be possible, by allowing the potential selection of one of several redundant columns for association with electrical redundancy control signals. Preferably, then, a defect-free redundant column can be allocated to post-repair after wafer fabrication. And also preferably, each defect-free redundant column can be, in the alternative, allocated to laser repair.

Figure 7:
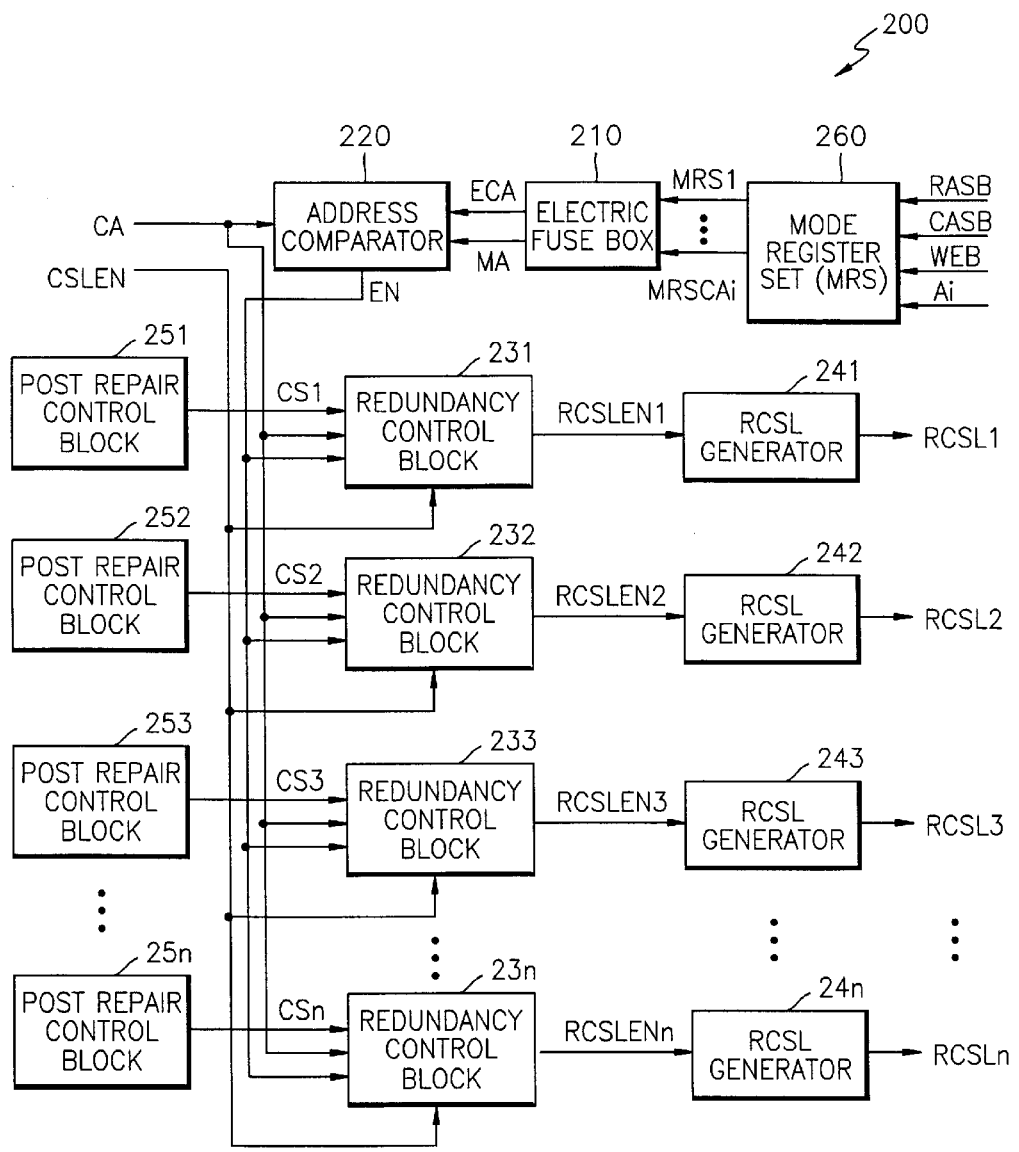
FIG. 7 contains a block diagram for a second embodiment of a dual-mode repair circuit, having means for associating an electric fuse block with one of several redundant columns.

FIG. 7 illustrates redundant column control circuit 200 of the second embodiment. Although similar to FIG. 2 in some ways, FIG. 7 contains post-repair control blocks 251 to 25n, different redundancy control blocks 231 to 23n, and control signal differences. These differences will be further explored with reference to FIGS. 7–10. In short, each redundancy control block 23i has laser fuse functionality, but can be configured to respond to the electric repair activation signal (EN). Thus no one redundant column is unconditionally fabricated for post-repair—all redundant columns can be used for laser fuse repair, if needed, and a defect-free redundant column can be associated, after wafer fabrication, with the post-repair electric fuse circuitry. This flexibility can provide for efficient use of defect-free redundant memory lines in a mix of wafer-stage and post-repair operations.

Like redundant column control circuit 100 of FIG. 2, control circuit 200 of FIG. 7 has an electric fuse box (210) that can be set using the mode register set to a desired post repair column address. Address comparator 220 compares address ECA from electric fuse box 210 to column address CA, and asserts EN when ECA and CA match (and master signal MA indicates that ECA is valid).

Whereas in FIG. 2 only the electric redundancy control block 131 receives EN from the electrical repair address comparator 120, each redundancy control block 231 to 23n in FIG. 7 receives EN from address comparator. Each redundancy control block 23i also receives column address CA, and a control signal CSi from a corresponding post-repair control block 25i. CSi determines whether redundancy control block 23i responds to EN, or uses CA in conjunction with a laser fuse/comparator within redundancy control block 23i to perform redundant column selection. In a typical usage, a fuse will be cut in one (and only one) of post-repair control blocks 25i to assert a corresponding CSi signal line, indicating the redundant column that will be used for post repair (if needed).

Figure 8:
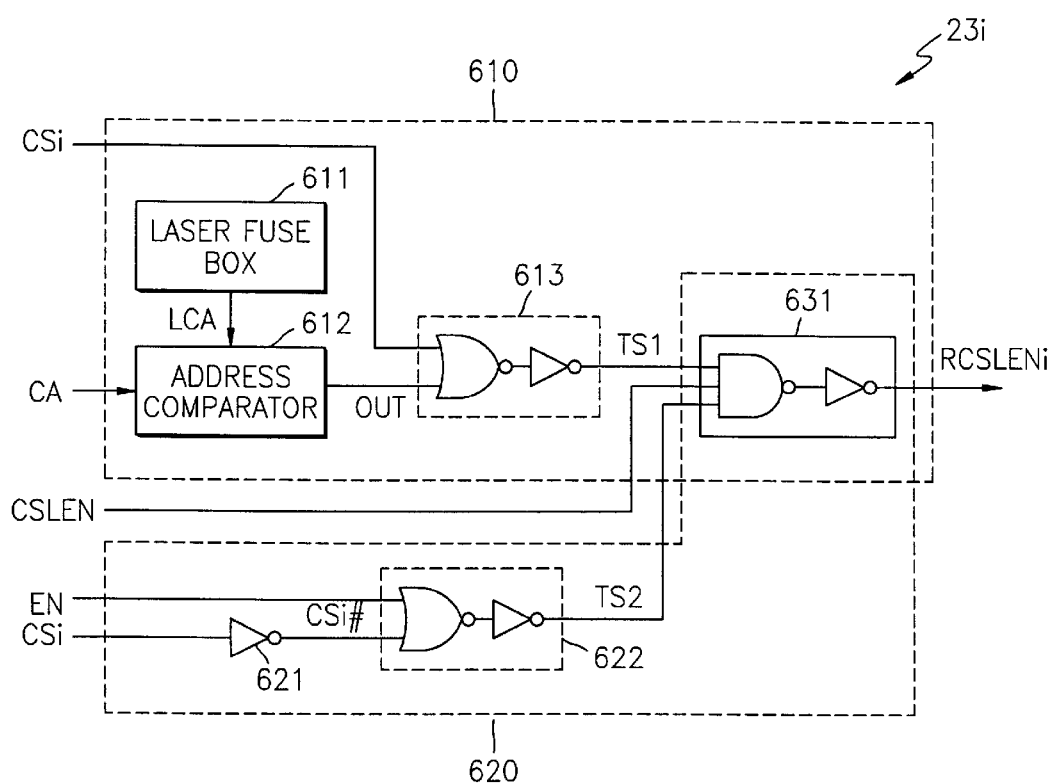
FIG. 8 shows additional circuit details for the redundancy control blocks of FIG. 7.

FIG. 8 illustrates the internal circuitry of a redundancy control block 23i. Each redundancy control block 23i (i=1~n) outputs a redundancy activation signal (RCSLENi, i=1~n) to a corresponding RCSL generator 24i (i=1~n, FIG. 7). Each redundancy control block 23i has a laser-repair-processing part 610 for laser repair, and a post-repair-processing part 620 for post repair.

The laser-repair-processing part 610 contains a laser fuse box 611, an address comparator 612, and a first logic unit 613.

The laser fuse box 611 has a plurality of fuses that can be cut by a laser beam. By selectively cutting laser fuses with a laser, the laser fuse box is programmed to generate an address LCA indicating a main array column in which a defective cell occurred.

Like address comparator 220, address comparator 612 asserts an output signal (OUT) when LCA and an external address (CA) match.

Logic unit 613 ORs OUT with control signal CSi to generate a first logic signal TS1. Thus if post-repair control block 25i has not asserted CSi (meaning redundancy control block 23i has not been selected for post repair), TS1 replicates OUT. But if CSi is asserted, indicating that this is a post-repair block, OUT is overridden, and TS1 will be asserted regardless of the state of OUT.

The post-repair-processing part 620 has an inverter 621 and a second logic unit 622. Inverter 621 generates CSi#, an inverted version of CSi. Second logic unit 622 ORs CSi# with electric repair activation signal EN from electric fuse address comparator 220 to generate a second logic signal TS2. Thus if post-repair control block 25i has asserted CSi, indicating that this is a post-repair block, TS2 replicates EN. But if CSi is deasserted, EN is overridden, and TS2 will be asserted regardless of the state of EN. Thus it is evident that redundancy control block 23i will respond to only one of comparator 612 output signal OUT and electric repair activation signal EN, this selection depending on the state of CSi.

A third logic unit 631 is shared by laser-repair-processing part 610 and post-repair-processing part 620. The third logic unit 631 ANDs the first and second logic signals (TS1, TS2) together with a column selection signal (CSLEN), and then outputs the redundancy activation signal (RCSLENi, i=1~n).

When a read or write command is received by the semiconductor memory device, an external column address CA (specifying the main array column to be accessed) accompanies the command. When the main column specified by CA has not been repaired, no repair fuse box (laser or electrical) will contain that address. When the main column specified by CA has been replaced with a redundant column during wafer-stage laser-fuse repair, that column address will have been stored in laser fuse box 611 of one of redundancy control blocks 23i. And when the main column specified by CA has been replaced with a redundant column during post-repair, that column address will have been stored in electric fuse box 210. CA is supplied to the address comparator 612 of each redundancy control block 23i, as well as to electric fuse address comparator 220 (FIG. 7). Each address comparator compares CA to its stored address (laser-fuse address LCA for a comparator 612, electric fuse address ECA for comparator 220). For a defective but repaired main column, one of the address comparators will detect a match for CA, and will assert its output signal (OUT for a comparator 612, EN for comparator 220). If the main column specified by CA has not been repaired, no comparator will assert its output signal.

The first or primary mode of operation for each redundancy control circuit 23i responds to a laser-fuse-programmed repair address. In this mode, CSi is deasserted, TS1 responds to OUT, and TS2 is always asserted. Thus when CA and LCA match—and CSLEN is asserted, indicating a column select output is appropriate—redundant column select signal RCSLENi is asserted. Otherwise, RCSLENi remains deasserted.

The alternate mode of operation for redundancy control circuit 23i responds to the electric-fuse-programmed repair address. In this mode, CSi is asserted, TS1 is always asserted, and TS2 responds to EN. Thus when CA and ECA are matched by address comparator 220—and CSLEN is asserted, indicating a column select output is appropriate—redundant column select signal RCSLENi is asserted. Otherwise, RCSLENi remains deasserted.

In the embodiment of FIG. 7, at most one of redundancy control blocks 23i will be set in the alternate mode of operation. All other redundancy control blocks are set to the primary mode of operation. Which control block 23i is set in the alternate mode of operation is determined by the state of post-repair control blocks 25i. Essentially, each post-repair control block 25i contains a fuse or other settable element. For instance, FIG. 9 contains a circuit diagram for one post-repair control block embodiment.

Figure 9:
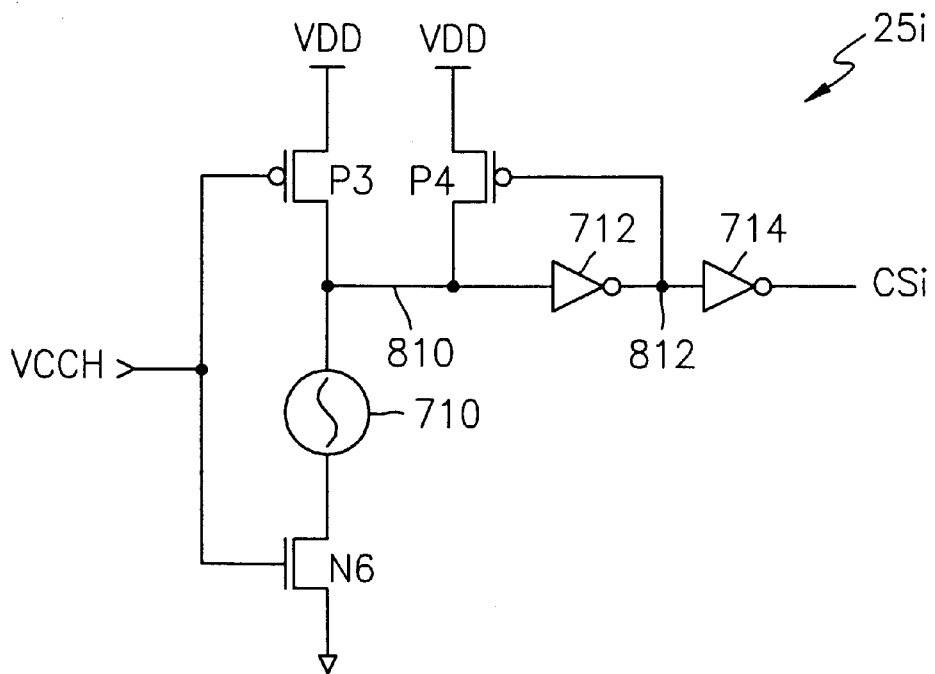
FIG. 9 illustrates a detailed circuit diagram for the post-repair control blocks of FIG. 7.

In FIG. 9, a post-repair control block 25i contains a post-repair fuse 710. Post-repair fuse 710 is a laser fuse that can be cut during wafer stage testing to change the state of control signal CSi. That is, when post-repair fuse 710 is left intact, CSi will remain at a low logic level, and when post-repair fuse 710 is cut, CSi attains a high logic level.

Post-repair control block 25i contains, in addition to fuse 710, two PMOS transistors P3 and P4, one NMOS transistor N6, and two inverters 712 and 714. PMOS transistors P3 and P4 each have a source connected to VDD and a drain connected to one end of fuse 710 (node 810). NMOS transistor N6 has its source connected to ground and its drain connected to the opposite end of fuse 710.

Node 810 also connects to the input of inverter 712. Node 812 connects the output of inverter 712 with both the input of inverter 714 and the gate of PMOS transistor P4. The output of inverter 714 is taken as the control signal CSi.

Figure 10:
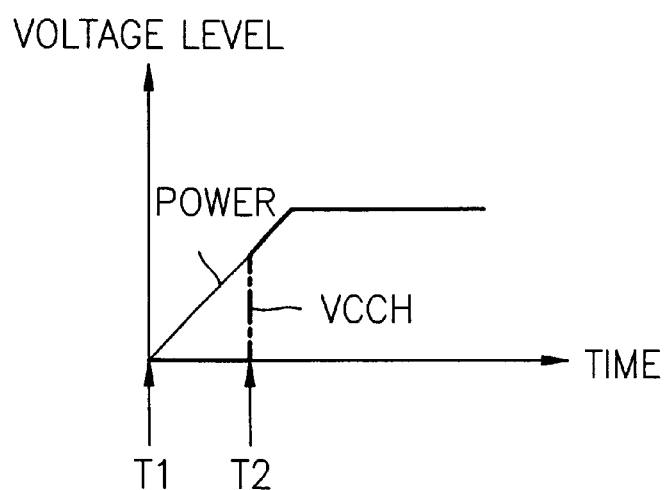
FIG. 10 plots the waveform diagram of a power-up signal that is input to the post-repair control block of FIG. 9.

The input signal to post-repair control blocks 25i is a power-up signal VCCH. The waveform of power-up signal VCCH is shown in FIG. 10. Power-up signal VCCH is at a low logic level when power is first supplied to the semiconductor memory device (time T1), and transitions to a high logic level once the power supply level reaches a predetermined level (at time T2). Power-up signal VCCH is supplied to the gates of transistors P3 and N6.

Post-repair control block 25i operates as follows. First, consider control block 25i with post-repair control fuse 710 cut. When the semiconductor memory device first powers on (time T1, FIG. 10), VCCH remains at a low logic level, turning on transistor P3. Since fuse 710 is cut, node 810 charges towards VDD. Node 810 will eventually be recognized by inverter 712 as a logic high level, driving node 812 to a low logic level and CSi to a high logic level.

At time T2 on FIG. 10, the power-up signal (VCCH) switches to a high logic level. Although setting VCCH to a high logic level turns off PMOS transistor P3, by this time the low logic level at node 812 has turned on PMOS transistor P4, thus maintaining the high logic level at node 810—and a high logic level for the control signal CSi.

Now consider the case where post-repair control fuse 710 is intact at power-up. In this state, node 810 initially attains a high logic level, as when fuse 710 is cut. But when power-up signal VCCH switches to a high logic level, transistor N6 is turned on, transistor P3 is turned off, and node 810 discharges toward ground. Inverter 712 senses a low logic level on node 810 and takes node 812 to a high logic level, turning off P4. Inverter 714 outputs a low logic level for control signal CSi.

With this embodiment, the redundant column line i that will be available for post repair is preferably selected while the device is in a wafer state. For instance, the redundant column lines can be tested to determine a redundant memory line that is defect-free. The defect-free redundant memory line is then designated for use in post repair. The designated memory line is associated with the post-repair address comparator 220 by cutting the laser fuse 710 in the post-repair control block associated with that memory line.

Also preferably, the selection of a redundant memory line for use in post repair can be accomplished in conjunction with a wafer stage laser fuse repair operation. For example, the main and redundant column lines can be tested at the wafer stage to determine which lines are defective and which are defect-free. For each defective main array column line, a defect-free redundant memory line is designated, and the laser fuse box 611 (FIG. 8) associated with that redundant memory line is programmed with the address of that defective main array column line. Then, when all defective main memory lines have been repaired and defect-free redundant memory lines remain undesignated, one of those remaining defect-free redundant memory lines is designated for use in post repair. The designated redundant memory line is associated with the post-repair address comparator 220 by cutting the laser fuse 710 in the post-repair control block associated with that memory line.

Subsequently, the memory device is packaged and subjected to a second test. If a memory column is found to be defective in the packaged state, repair is attempted by issuing a command that causes mode register set 260 to set electric fuse box 210 with the defective column's address. If a post-repair block 25i was available after laser repair and designated for post repair, post repair should be possible.

Figure 11:
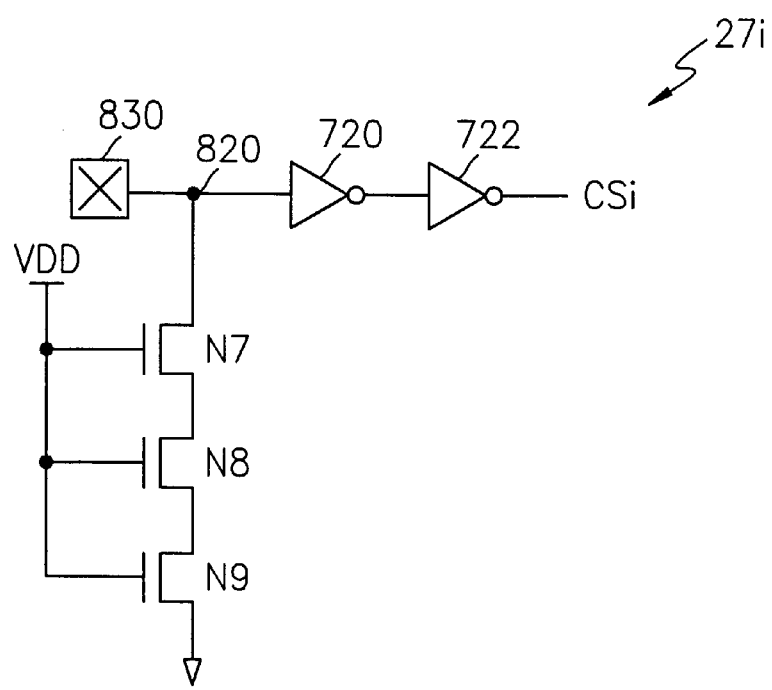
FIG. 11 illustrates an alternate embodiment for the post-repair control blocks of FIG. 4.

Although it is preferable to select a column for post repair during wafer stage test and programming, other embodiments are possible. For instance, FIG. 11 illustrates an alternate post-repair control circuit embodiment 27i that allows selection of a column for post repair through a bonding pad 830. In one state, bond pad 830 is left disconnected. NMOS transistors N7, N8, N9 pull node 820 low, causing inverters 720 and 722 to register a low logic level for CSi. In an alternate state, bond pad 830 is connected to VDD, thus setting node 820 and CSi to a high logic level. To set CSi high and select a given redundant column for post repair, bond pad 830 could be wire-bonded to a VDD pad during wire bonding. Alternately, bond pad 830 could be wire-bonded to a lead on a chip carrier, and that lead could be connected to VDD, external to the device, to select the corresponding redundant column for post repair.

Figure 12:
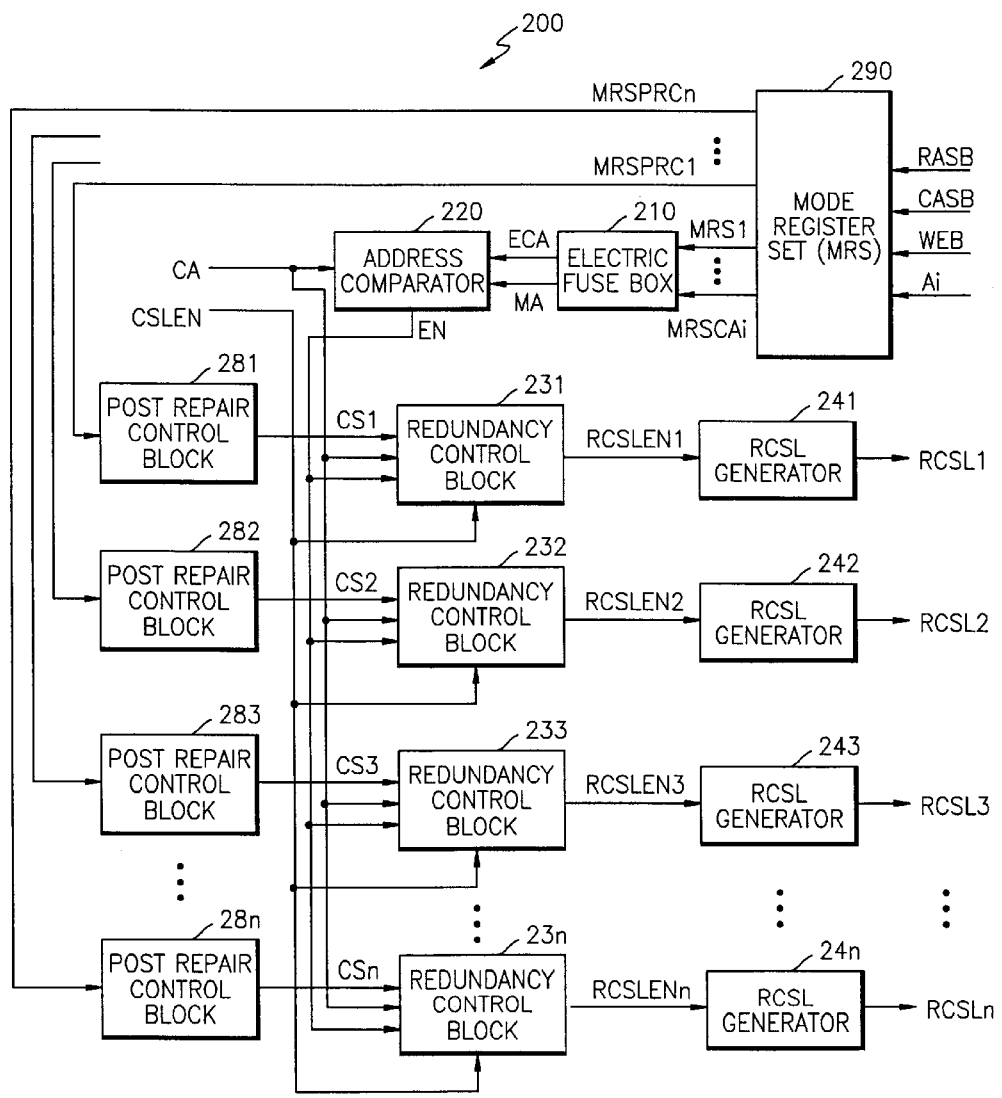
FIGS. 12 and 13 contain a repair circuit block diagram and post-repair control block circuit diagram for a third embodiment of a dual-mode repair circuit, with electrical fuse post-repair blocks.
Figure 13:
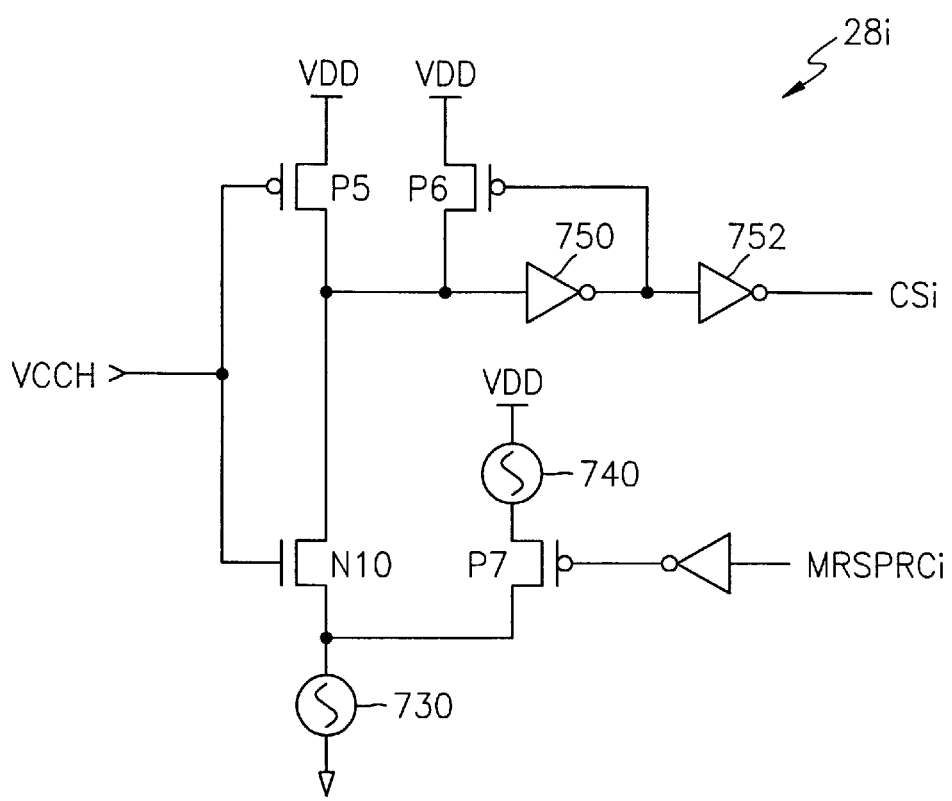

Another alternate selection embodiment is illustrated in FIGS. 12 and 13. This embodiment allows selection, after packaging, of a redundant column for association with post-repair comparator 220. In FIG. 12, each post-repair control block 28i (i=1~n) is electrically programmable through a corresponding control line MRSPRCi from mode register set 290. To associate a given post-repair control block 28i with electric fuse box address comparator 220, a command is issued with an address that asserts the control line MRSPRCi, thus cutting an electrical fuse in post-repair control block 28i and causing control signal CSi to become asserted.

In this embodiment, one difficulty may be in determining which redundancy control blocks 23i (and corresponding column lines) are still available and defect-free. To alleviate this problem, each post-repair control block 28i contains a laser fuse that will prevent the electrical fuse in that post-repair control block 28i from being cut. Thus, during wafer stage programming, as each redundancy control block 23i is used for laser repair, a laser fuse in the corresponding post-repair control block 28i is also cut to prevent electrical programming of that post-repair control block. When a given redundant column is found to be defective, the laser fuse in the corresponding post-repair control block 28i can also be cut to prevent electrical programming of that post-repair control block.

Then, during post repair of a defective column, selection and electrical fuse cutting of a post-repair control block 28i is attempted for a first value of i. If, after this first selection, the defective column has not been repaired, it can be assumed that post-repair control block 28i was disabled. A new value of i is selected, and the process is repeated, until either a successful repair is completed, or all values of i have been unsuccessfully used, at which time post repair has failed.

FIG. 13 illustrates one possible circuit useful as post-repair control block 28i. Fuse 730 is an electrical fuse. Control block 28i operates similar to control block 25i (FIG. 9), in that, with fuse 730 intact, CSi is at a low logic level after power-up, and with fuse 730 blown, CSi is at a high logic level after power-up. To cut fuse 730, MRSPRCi is asserted, turning on transistor P7 and causing a large transient current to flow through fuse 730. Note that this current also flows through fuse 740, and therefore fuse 740 should be designed to handle this current without blowing first.

To prevent the programming of control block 28i to a high logic level, fuse 740 is laser cut. When fuse 740 is cut, a transient current through fuse 730 will not be generated when MRSPRCi is asserted.

Figure 14:
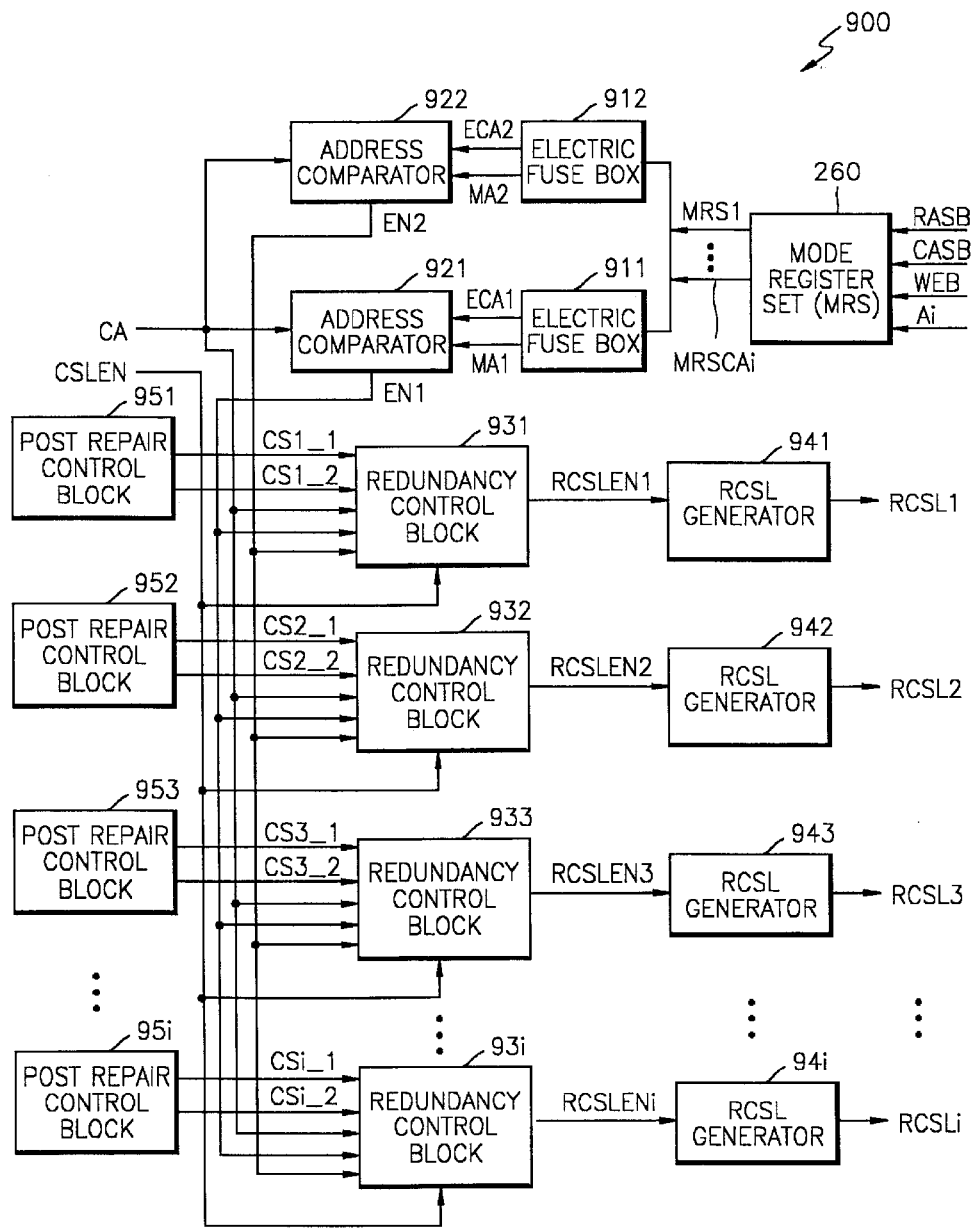
FIG. 14 contains a block diagram for a fourth embodiment of a dual-mode repair circuit with two separate post-repair electric fuse blocks, either of which can be associated with any redundant memory line.

Although the preceding embodiments have illustrated circuits that allow a single post-repair operation, the invention is not so limited. For instance, FIG. 14 contains a block diagram for a repair circuit embodiment 900 capable of performing two post-repair operations. Repair circuit 900 has redundancy control blocks 931 through 93n, RCSL generators 941 through 94n, and post-repair control blocks 951 through 95n, similar to the post-repair circuit 200 shown in FIG. 7. However, repair circuit 900 has two electric fuse boxes 911 and 912 and two address comparators 921 and 922, unlike the post-repair circuit 200.

The two electric fuse units, 911 and 912, are separately programmable through mode register set signals MRS1 and MRSCAi. Note that one mode register set signal can be used by the electric fuse units to gate the remaining mode register set signals, such that each electric fuse unit can be programmed independently.

Fuse unit 911 generates a first electric column address ECA1, and fuse unit 912 generates a second electric column address ECA2. Address comparator 921 compares CA with ECA1 and asserts a first enable signal EN1 when a match is detected. Address comparator 922 compares CA with ECA2 and asserts a second enable signal EN2 when a match is detected.

The first and second enable signals (EN1, EN2) are input to the redundancy control blocks 931 through 93n.

The redundancy control blocks 931 through 93n may perform laser repair or post-repair according to the control signals (CSi, i=1~n) from the post-repair control blocks 951 through 95n, and the first and second electric repair activation signals (EN1, EN2). In circuit 900, however, each control signal CSi comprises two signal lines: one signal line CSi-1 is paired with EN1, and the other signal line CSi-2 is paired with EN2. Redundancy control block 93i will function as a laser repair block when CSi-1 and CSi-2 are both at a low logic level. Redundancy control block 93i will function as a post-repair control block, responding to repair address ECA1, when CSi-1 is at a high logic level and CSi-2 is at a low logic level. And redundancy control block 93i will function as a post-repair control block, responding to repair address ECA2, when CSi-1 is at a low logic level and CSi-2 is at a high logic level.

To generate two control signals, each post-repair block 95i contains two laser fuses and two sets of circuitry similar to that shown in FIG. 9.

Figure 15:
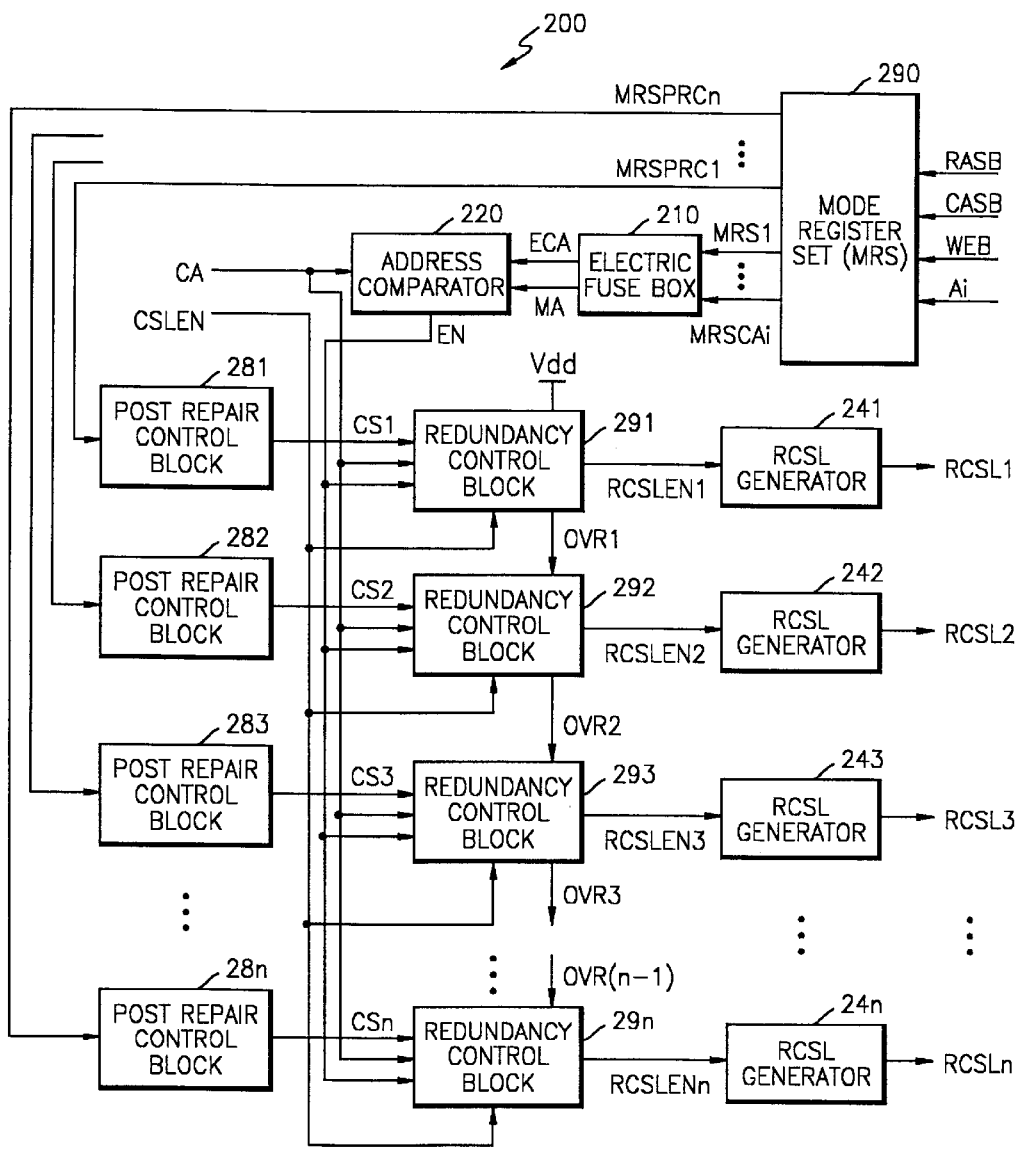
FIG. 15 contains a block diagram for a fifth embodiment of a dual-mode repair circuit, with redundancy control blocks having the capability to override a failed prior repair attempt.

FIG. 15 contains a block diagram for a variation on the repair circuit embodiment 200 of FIG. 12. This embodiment allows correction of two possible failure cases that cannot be corrected by the FIG. 12 embodiment. The first failure case is a column that has been laser repaired, but the repair column associated with the laser repair has subsequently failed. The second failure case is a column that has been designated as a post-repair column, but after this repair attempt it is discovered that the designated post-repair column is faulty. In either case, the FIG. 12 embodiment cannot enact a further repair of that specific address with a different redundant column, as two different repair columns would be activated by that address.

To cover these failure cases, the FIG. 15 embodiment extends the concept of the post repair control block override. The concept is further applied between redundancy control blocks. As shown, redundancy control block 291, generates an override signal OVR1 to redundancy control block 292; redundancy control block 292 generates an override signal OVR2 to redundancy control block 292, and this pattern repeats down to redundancy control block 29n. Any redundancy control block receiving a low logic level on its input override signal performs two functions in response: one, it passes the low logic level down to the next redundancy control block on its own generated override signal; two, it blocks its own RCSLEN signal from being asserted, even if an address match exists that would otherwise cause that RCSLEN signal to be asserted. A redundancy control block will also assert its own generated override signal when not blocked, and an address match occurs with its programmed address.

In practice, with this embodiment redundancy control blocks 29i and post repair control blocks 28i can be used starting from block n, and proceeding upward towards block 1. For example, assume that during laser repair, several defective columns are repaired—the last of which is repaired by laser-programming a given repair address RA3 into redundancy control block 293, leaving redundancy control blocks 292 and 291 available for post repair (post repair control blocks 283 through 28n are accordingly disabled during laser repair, as described previously). Redundancy control block 293 asserts RCSLEN3 whenever CA equals RA3 and CSLEN is enabled.

Then, after packaging and during post repair testing, a failure is detected for address RA3. This most likely means that a failure has occurred on the redundant column associated with redundant control block 293. But the post repair test cannot tell that this address has already been repaired once, and so it attempts to repair the address again. Address RA3 is first programmed into electric fuse box 210. The repair system then attempts to program post repair control block 28n, but this block was disabled during laser repair, and so the attempt was unsuccessful. The repair system attempts to program control block 28(n−1), etc., up to control block 282, before it successfully programs a post repair control block. CS2 transitions to a logic high level once programming is complete.

Now, when column RA3 is tested, CA matches ECA. Thus EN and CS2 are both asserted, and control block 292 asserts RCSLEN2 to selects its associated redundant column. Concurrently, redundancy control block transitions its override signal OVR2 to a low logic level. Redundancy control block 293, sensing that OVR2 is now at a low logic level, blocks RCSLEN3 from being asserted, even though its own internal address comparator detects a match.

Taking this example one step further, it is also possible that the repair column associated with RCSL2 is defective. Thus despite the electric post repair, a defect (perhaps a different defect) still occurs when column RA3 is tested. The post repair system has one more post repair control block, 281, to use, and so it programs post repair control block 281. Now, both CS1 and CS2 are asserted. When CA equals RA3, redundancy control blocks 291, 292, and 293 sense an internal address match. But block 291, having priority with its OVR1 signal, blocks redundancy control block 292 from asserting RCSLEN2 (block 292 in turn blocks redundancy control block 293).

Figure 16:
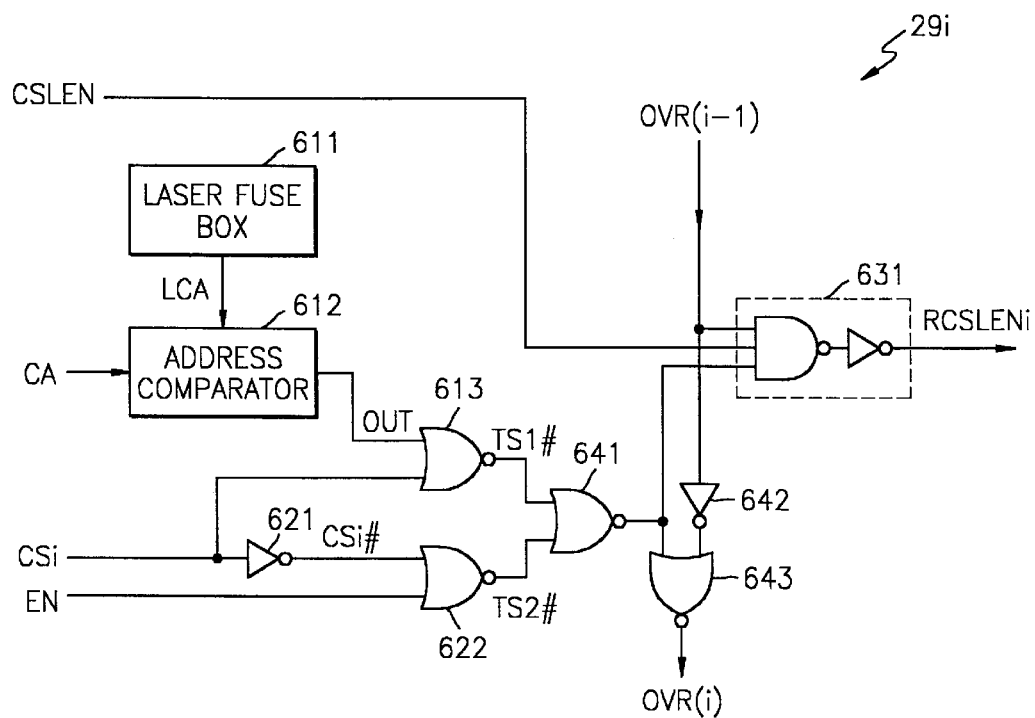
FIG. 16 illustrates an embodiment of the redundancy control block of FIG. 15.

FIG. 16 illustrates one example of a redundancy control block 29i that accomplishes the functions just described.

Laser fuse box 611 and address comparator 612 function as described previously with respect to FIG. 8. Logic unit 613 NORs OUT with control signal CSi to generate a first logic signal TS1#. Second logic unit 622 NORs CSi# with electric repair activation signal EN to generate a second logic signal TS2#. NOR gate 641 takes TS1# and TS2# as inputs, and produces an input to a third logic unit 631. The other inputs to logic unit 631 are CSLEN and OVR(i−1). Logic unit 631 ANDs these three signals together to produce the column select enable signal RCSLENi. Note that when OVR(i−1) is at a logic low level, it effectively inhibits the assertion of RCSLENi.

Two additional logic gates are used to create the output override signal OVRi. Inverter 642 inverts OVR(i−1). NOR gate 643 accepts (as inputs) the output of NOR gate 641 and the output of inverter 642. The output of NOR gate 643 forms the output override signal OVR1. During operation, OVRi is forced low whenever OVR(i−1) is low. OVR1 is also forced low if both TS1# and TS2# are low, indicating that redundancy control block 29i has detected an address match.

Many variations on the illustrated embodiments are possible. For instance, the association between redundancy control blocks and redundant memory lines could have multiple possible configurations. Where some redundancy control blocks have dual-mode (wafer-stage laser fusing and post-repair programming) capability, this capability need not extent to all redundancy control blocks. Likewise, where two post-repair address/compare units are present, one of the address/compare units can be programmable among a subset of the redundancy control blocks, and the other unit can be programmable among a mutually exclusive subset—thus alleviating the need for multiple-fuse post-repair control blocks and multiple CSi signal lines. The post-repair control blocks need not have a 1:1 correspondence with the redundancy control blocks—for instance, three fuses could be used to generate seven unique CSi signals (and one no-select case) using decoding logic.

The redundancy lines may be redundancy columns arranged in the column direction, redundancy rows arranged in the row direction, or both. If the redundancy lines are redundancy columns, defective columns are replaced, and if the redundancy lines are redundancy rows, defective rows are replaced.

What is claimed is:

1. A semiconductor memory device comprising:
    a set of nominally addressable main memory lines, each line connected to a corresponding plurality of main memory cells;
    a first redundant memory line connected to a first plurality of redundant memory cells; and
    a redundant memory line control circuit capable of selecting the first redundant memory line whenever an input address matches a selected memory line address, the redundant memory line control circuit having primary and alternate settable modes, the primary mode selecting the redundant memory line based on a first comparison of the input address to a first primary stored address, the alternate mode selecting the redundant memory line based on a second comparison of the input address to a first alternate stored address, wherein the first alternate stored address can be stored after the memory device is packaged.

2. The memory device of claim 1, the redundant memory line control circuit comprising:
    a first laser fuse box to store the first primary stored address;
    a first post-repair address box to store the first alternate stored address;
    a first primary address comparator to perform the first comparison and enable a first primary signal when the first comparison evaluates true;
    a first post-repair address comparator to perform the second comparison and enable a first alternate signal when the second comparison evaluates true; and
    mode selection circuitry to select the redundant memory line based on the first primary signal in the primary mode and to select the redundant memory line based on the first alternate signal in the alternate mode.

3. The memory device of claim 2, further comprising a mode register set circuit, wherein the post-repair address box comprises a plurality of electric fuse units to store the first alternate stored address, the electrical fuse units storing the first alternate stored address based upon a set of mode register set signals generated from the mode register set circuit in response to an external command issued subsequent to device packaging.

4. The memory device of claim 2, wherein the mode selection circuitry comprises a post-repair control block having a laser fuse and generating a control signal, the post-repair control block setting the control signal to a first logic level when the laser fuse is intact and setting the control signal to a second logic level if the laser fuse is cut.

5. The memory device of claim 4, having a power-up signal circuit to generate a power-up signal, the power-up signal remaining at a temporary low logic level upon device power-up until the voltage supplied to the device reaches a preset threshold, after which the power-up signal switches to a high logic level, the post-repair control block responsive to the power-up signal.

6. The memory device of claim 5, the post-repair control block having a latch responsive to the power-up signal, the post repair block setting the latch to a first logic level while the power-up signal remains at a low logic level, the post repair control block having the capability to either remain at the first logic level or switch to a second logic level, depending on whether the laser fuse has been cut, after the power-up signal switches to a high logic level.

7. The memory device of claim 4, wherein the mode selection circuitry further comprises gating logic to replicate either the first primary signal or the first alternate signal as a redundant memory line enable, depending on whether the control signal is set to the first or the second logic level.

8. The memory device of claim 7, further comprising a column select signal as an input to the mode selection circuitry, wherein the redundant memory line enable further depends on the state of the column select signal.

9. The memory device of claim 2, wherein the mode selection circuitry comprises a post-repair control block having a bonding pad and generating a control signal, the post-repair control block setting the control signal to a first logic level when the bonding pad is wired to a reference voltage, and setting the control signal to a second logic level when the bonding pad is not wired to the reference voltage.

10. The memory device of claim 9, the post repair control block further comprising a pulldown circuit and a buffer, the pulldown circuit having a pulldown node connected to both the buffer input and the bonding pad such that, when the bonding pad is not wired to the reference voltage, the pulldown circuit pulls the buffer input to a low logic level, and, when the bonding pad is wired to the reference voltage, the buffer input remains substantially at the reference voltage.

11. The memory device of claim 2, wherein the mode selection circuitry comprises a post-repair control block having a bonding pad and generating a control signal, the post-repair control block setting the control signal to a first logic level when the bonding pad is wired to a power supply voltage, and setting the control signal to a second logic level when the bonding pad is wired to a ground voltage.

12. The memory device of claim 2, further comprising a mode register set circuit, wherein the mode selection circuitry comprises a post-repair control block having an electrical fuse and generating a control signal, the post-repair control block setting the control signal to a first logic level when the electrical fuse is intact and setting the control signal to a second logic level when the electrical fuse is cut, wherein the electrical fuse is cut based upon a mode register set signal generated from the mode register set circuit in response to an external command issued subsequent to device packaging.

13. The memory device of claim 12, wherein the post-repair control block further comprises a laser fuse, the laser fuse having one state that prevents the state of the control signal from being altered by electrical programming.

14. The memory device of claim 2, further comprising a second redundant memory line connected to a second plurality of redundant memory cells, the redundant memory line control circuit further comprising:

a second laser fuse box to store a second primary stored address; and a second primary address comparator to compare the input address to the second primary stored address and enable a second primary signal when that comparison evaluates true;

the redundant memory line control circuit capable of selecting the second redundant memory line based on the second primary signal in the primary mode.

15. The memory device of claim 14, the mode selection circuitry having the capability to select the second redundant memory line, instead of the first redundant memory line, based on the first alternate signal in the alternate mode.

16. The memory device of claim 14, further comprising:

a second post-repair address box to store a second alternate stored address; and a second post-repair address comparator to perform a third comparison of the input address to the second alternate stored address, and enable a second alternate signal when the third comparison evaluates true;

wherein the mode selection circuitry is capable of selecting the first redundant memory line based on the second alternate signal in the alternate mode.

* * * * *